(12) United States Patent  (10) Patent No.: US 6,490,162 B2
Siu  (45) Date of Patent: Dec. 3, 2002

(54) HEATSINK RETAINER

(75) Inventor: Stephen Nicholas Siu, Los Angeles, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/929,682

(22) Filed: Aug. 14, 2001

(65) Prior Publication Data

US 2002/0080586 A1 Jun. 27, 2002

Related U.S. Application Data

(60) Provisional application No. 60/227,304, filed on Aug. 24, 2000.

(51) Int. Cl.[7] .................................................. H05K 7/20
(52) U.S. Cl. ........................ 361/719; 24/458; 174/52.2; 257/719
(58) Field of Search ..................... 24/453, 457, 458, 24/625; 248/505, 510; 267/150, 158, 160; 165/80.3, 185; 174/16.3, 52.2; 257/796, 718, 719, 726, 727; 361/695, 697, 703–705, 709–712, 717–719, 761, 784, 785

(56) References Cited

U.S. PATENT DOCUMENTS

| | | | |
|---|---|---|---|
| 5,014,159 A | * | 5/1991 | Butt ........................... 361/717 |
| 5,329,426 A | * | 7/1994 | Villani ........................ 361/719 |
| 5,663,869 A | | 9/1997 | Viniarelli et al. |
| 5,677,616 A | * | 10/1997 | Ooiwa ......................... 322/17 |
| 5,909,358 A | | 6/1999 | Bradt |
| 5,926,370 A | | 7/1999 | Cromwell |
| 5,994,774 A | | 11/1999 | Siegel et al. |
| 6,028,770 A | * | 2/2000 | Kerner et al. |
| 6,251,707 B1 | * | 6/2001 | Bernier, Jr. et al. |

* cited by examiner

*Primary Examiner*—Gerald Tolin
(74) *Attorney, Agent, or Firm*—Ostrolenk, Faber, Gerb & Soffen, LLP

(57) ABSTRACT

A power module having a power circuit board free of mounting holes and more usable surface area for disposition of copper traces is shown. The power module includes a power shell that snaps onto the underside of the power circuit board. The power shell has embedded therein a thermally conductive substrate. One or a plurality of power semiconductor devices are disposed over one side of the thermally conductive substrate. A heatsink is mounted to the underside of the power shell in thermal contact with the thermally conductive substrate. The heatsink is mounted to the underside of the power shell by a heatsink retainer which biases the heatsink against the substrate. The heatsink retainer is mounted on retainer posts which extend from the underside of the power shell.

25 Claims, 12 Drawing Sheets

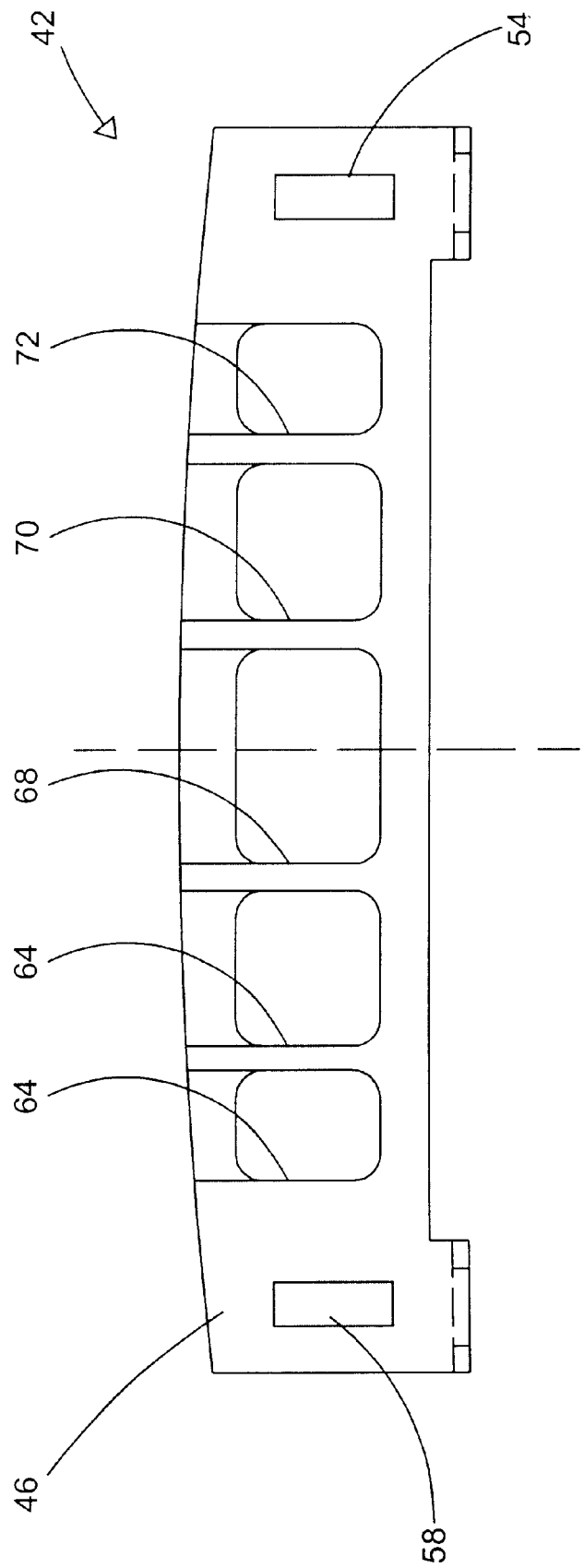

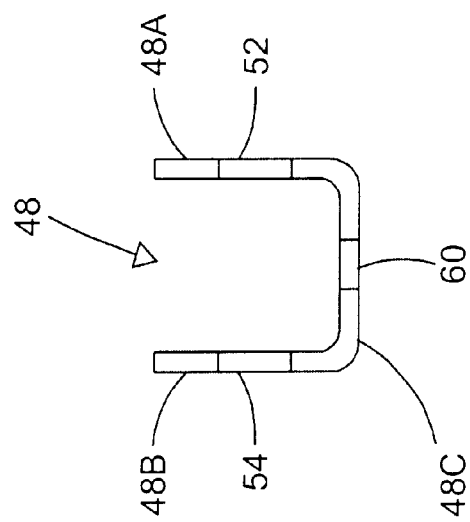
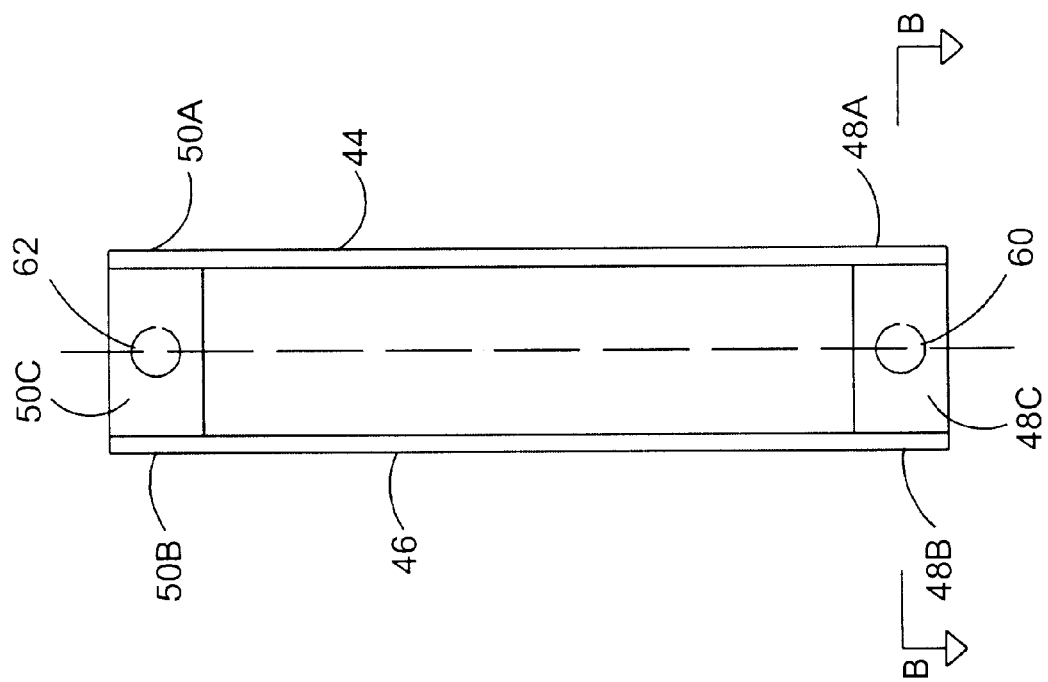

HEATSINK RETAINER

RELATED APPLICATIONS

This application is based on the U.S. Provisional Application No. 60/227,304, filed on Aug. 24, 2000, entitled Heatsink Retainer, the entire disclosure of which is incorporated herein by reference.

FIELD OF THE INVENTION

This invention relates to power modules and more particularly to a heatsink retainer for fastening a heatsink to a power module.

BACKGROUND OF THE INVENTION

Power modules all include power electronic devices such as MOSFETs, power diodes, IGBTs, power bipolar transistors, etc. These devices generate heat during their operation which adversely affects their performance. Therefore, in every module design extraction and dissipation of generated heat is an important design concern.

In many power modules, the power electronic devices are mounted on a thermally conductive substrate such as an insulated metal substrate (IMS). The devices are thermally coupled to the substrate so that their generated heat may be transferred to the substrate during operation. The substrate is then placed in intimate contact with a heatsink. The heatsink through its intimate contact with the substrate draws heat that is transferred from the power electronic devices to the substrate away from the substrate and dissipates it to the ambient. Thereby, heat is extracted from the power electronic devices and dissipated and thus the power electronic devices are kept relatively cool during operation.

Typically, a heatsink is an extruded plate of thermally conductive material such as a thermally conductive metal, for example, aluminum. Some heatsinks are extruded with fins that are integral with and extend away from one surface of the heatsink base, i.e. the portion of the heatsink that makes contact with the substrate. The fins provide for additional surface area which improves the cooling performance of the heatsink. In some heatsink designs narrow slots are cut through the fins in order to increase the area on the edges of the fins to provide for air flow across the fins, which also increases cooling performance of the heatsink. The slots in these heatsinks may be deep enough to reach the base of the heatsink.

Many conventional methods are used to place a heatsink in intimate contact with a heat producing electronic device. For example, in the construction of Pentium® chip cooler assemblies, it is standard practice to fasten an extruded heatsink to the Pentium® chip using a light force spring metal stamping or a clip. The clip is designed to pass between extruded fins to contact and pressure the bottom surface of the heatsink base to the Pentium® chip. Such clips include arms which extend roughly perpendicular to the heatsink base and engage corresponding hooks on the plastic casing of the Pentium® chip. In some cases, the mounting hardware (e.g. clip) is perpendicular to (across) the direction of the extrusion of the fins. Where it is necessary to mount the clip perpendicular to the fins of the heatsink, it is common practice to remove fin material from all fins to create the necessary clearance for the clip. Thus, a typical clip used to place a heatsink to a Pentium® chip consumes space on either side of the extrusion which may be needed for other components.

In many power module designs, the substrate and the heatsink are disposed below a power circuit board (PCB). The PCB typically has disposed thereon electronic control elements which control the power electronic devices. The electronic control elements are interconnected via, for example, copper traces that lay atop the PCB. In some modules, an opening is provided in the PCB, and the control elements and the power electronic devices are connected together via wire bonds that reach the power electronic devices through the opening. For example, in some designs the copper traces terminate at bond wire posts which are provided atop the PCB and disposed at or near the opening in the PCB. The bond wires are then connected to the bond wire posts at one end and connected to an electrical contact on a respective power electronic device on the substrate at the other end. Other means, for example vias, can be used to electrically connect the control elements on the PCB and the power electronic devices without providing an opening in the PCB.

To ensure that the heat is properly transferred, the substrate and the heatsink are held closely together. Where the substrate and the heatsink are disposed below the PCB, the heatsink is assembled on the PCB with fasteners. To accommodate the fasteners, the PCB typically includes mounting holes which extend through the body of the PCB. These holes take away space on the PCB. Moreover, since the fasteners are typically grounded, the copper traces on the PCB must be placed far from the site of the fasteners due to creepage and strike concerns. This is a drawback in module design. This drawback is particularly amplified in modules that employ a PCB that has an opening therein for bond wires in that areas around the opening have considerably less surface area. Therefore where the fasteners are located near the opening (as they typically are) the proper positioning of copper traces on the PCB is difficult.

It is therefore desirable to have a module that does not suffer from the drawbacks of these conventional arrangements.

SUMMARY OF THE INVENTION

A power module according to the present invention includes a heatsink retainer for assembling a heatsink onto the module. A heatsink retainer according to the present invention mounts a heatsink without the necessity of providing mounting holes or mounting notches on the PCB which results in conserving board space that can be used for current carrying copper traces.

A power module having a retainer according to the present invention includes a power shell which has embedded therein a thermally conductive power substrate such as an IMS. The power shell includes snaps on two opposing edges thereof. The snaps fit onto corresponding protrusions on a PCB so as to mount the power shell to the underside of the PCB. In a preferred embodiment, the power shell includes at least one flange that fits into a corresponding slot in the body of the PCB to prevent the power shell from moving along the edges of the PCB.

The power shell also includes two heatsink retainer posts which extend from the underside of the power shell. The heatsink retainer is mounted onto the underside of the power shell by the heatsink retainer posts to bias a heatsink to the thermally conductive substrate.

A heatsink retainer according to the present invention includes two blade portions each having a free edge for making contact with a heatsink, and two U-shaped brackets each being connected to an end of one of the blades. According to another aspect of the invention, the edges of the heatsink retainer that make contact with the heatsink are arcuate.

According to one embodiment of the invention, the power shell includes two heats ink retainer posts, each being disposed on an opposing edge of the thermally conductive substrate. One of the retainer posts is U-shaped, and the other is bar-shaped. The U-Shaped retainer post provides an opening that receives one of the brackets of the heatsink retainer while the other bracket of the heatsink retainer fits over the top of the bar-shaped retainer post. In a preferred embodiment, the bar-shaped retainer post includes a blind mounting hole for receiving a mounting fastener that is placed through the bracket on the heatsink retainer. Preferably, one or more snaps may be provided on either side of the bar-shaped retainer post to snap into corresponding openings on the bracket that is placed over the bar-shaped retainer post.

According to another embodiment, there are two heatsink retainer posts that extend from the underside of the power shell and are disposed on the opposing edges of the thermally conductive substrate. Each one of the heat sink retainer posts in this embodiment receives a bracket on the heatsink retainer in an identical manner.

According to an aspect of the present invention, the heatsink, includes a plurality of laterally positioned fins extending from a heatsink base, and a plurality of laterally spaced slots each extending orthogonal to the direction of elongation of the fins. The blades of the heat sink retainer fit inside of at least two laterally spaced slots and are placed in contact with the heatsink base.

According to another aspect of the present invention the blades of heatsink retainer may include several openings so as to not interfere with the passage of cooling air between the fins of the heatsink.

Other features and advantages of the present invention will become apparent from the following description of the invention which refers to the accompanying drawings.

BRIEF DESCRIPTION OF THE DRAWINGS

FIG. 5 shows a side view of a heatsink retainer according to the present invention;

FIG. 6 shows a top view of a heatsink retainer according to the present invention;

FIG. 6A shows a cross section of a mounting bracket on the heatsink retainer.

DETAILED DESCRIPTION OF EMBODIMENTS OF THE INVENTION

Figure 1:
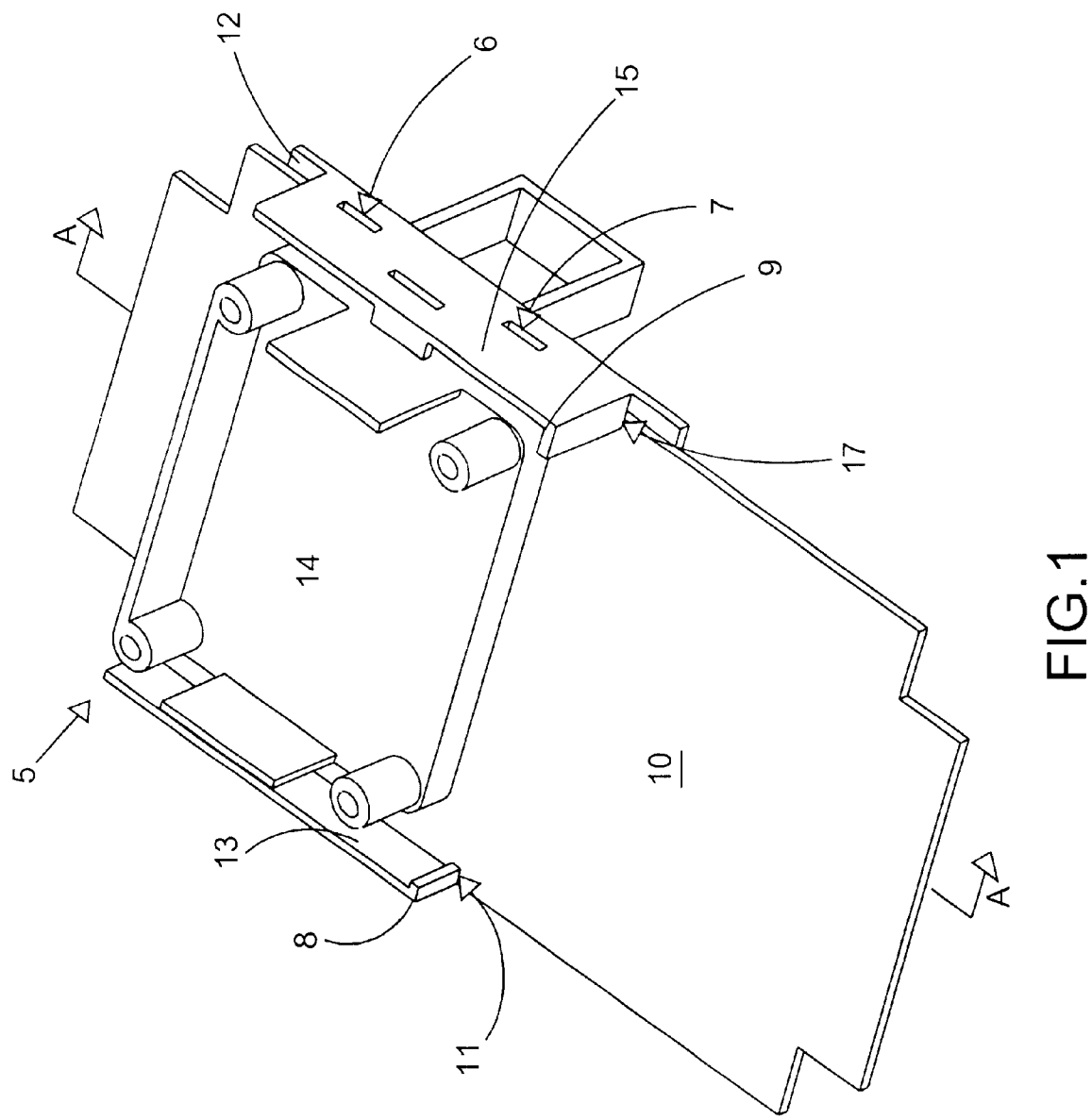
FIG. 1 is a perspective top view of part of a power module according to the present invention.

Referring to FIG. 1, a power module 5 according to the present invention preferably includes a PCB 10; and a power shell 12. Power shell 12 includes two power shell walls 13, 15. Power shell walls 13, 15 include power shell snaps (e.g. 6, 7) which snap onto corresponding protrusions on PCB 10 thereby mounting power shell 12 onto the underside of PCB 10. Power shell walls 13, 15 also include flanges 8, 9 respectively. Flanges 8, 9 fit into corresponding notches 11, 17 on PCB 10. The engagement of flanges 8, 9 with corresponding slots 11, 17 on PCB 10 further hinders the movement of power shell 12 along the edges of PCB 10 and thus further secures power shell 12 onto PCB 10 without the use of conventional fasteners that require fastener holes in the body of PCB 10.

PCB 10 includes various control components (not shown) for controlling the operation of power electronic devices (not shown), such as power diodes, MOSFETs, IGBTs or triacs. The control components are preferably electrically connected via copper traces (not explicitly shown) on PCB 10, and preferably electrically connected to the power electronic devices via wire bonds (not shown) as will be described later.

Figure 2:
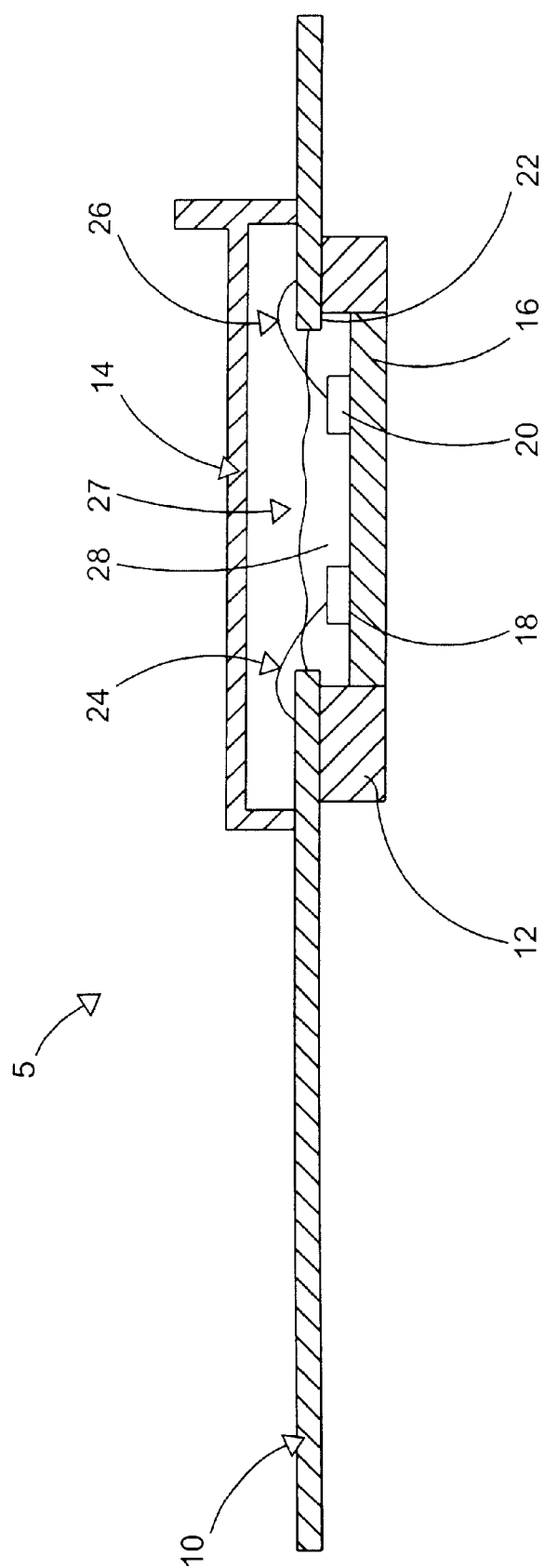
FIG. 2 shows a cross section of power module of FIG. 1 along line A—A.

FIG. 2 shows a cross-section of power module 5 shown in FIG. 1 along line A—A. As shown, a power module according to the present invention includes a power substrate 16. Power substrate 16 may be an IMS, or a circuitized ceramic substrate such as Direct Bond Copper ("DBC") or some other thermally conductive substrate. Such substrates are commercially available using various ceramics such as Alumina ($Al_2O_3$), Silicon Nitride (SiN), and Aluminum Nitride (AlN). The invention could apply to any substrate needing to be retained against a heatsink for the purposes of thermal management. A plurality of power semiconductor devices 18, 20 are disposed on and thermally coupled with power substrate 16. PCB 10 includes an opening 22 which is positioned over power substrate 16 so that power semiconductor devices 18, 20 are electrically connected to PCB 11 preferably via wire bonds 24, 26. Power substrate 16 is preferably embedded in power shell 12. Power shell 12 is disposed underneath PCB 10 and is preferably in surface-to-surface contact with the bottom surface of PCB 10, such that a well 27 is created at the bottom of which power substrate 16 is disposed. Due to relatively high temperatures generated during operation (up to 100° C. in some cases), power s hell 12 is preferably made from high grade, temperature resistant plastic. This helps the integrity of the contact between the substrate and the heatsink even at elevated temperatures.

Potting compound 28 is preferably deposited over semiconductor devices 18, 20, and preferably partially fills well 27. A gel box 14 is disposed over well 27 so as to cover the same.

Figure 3:
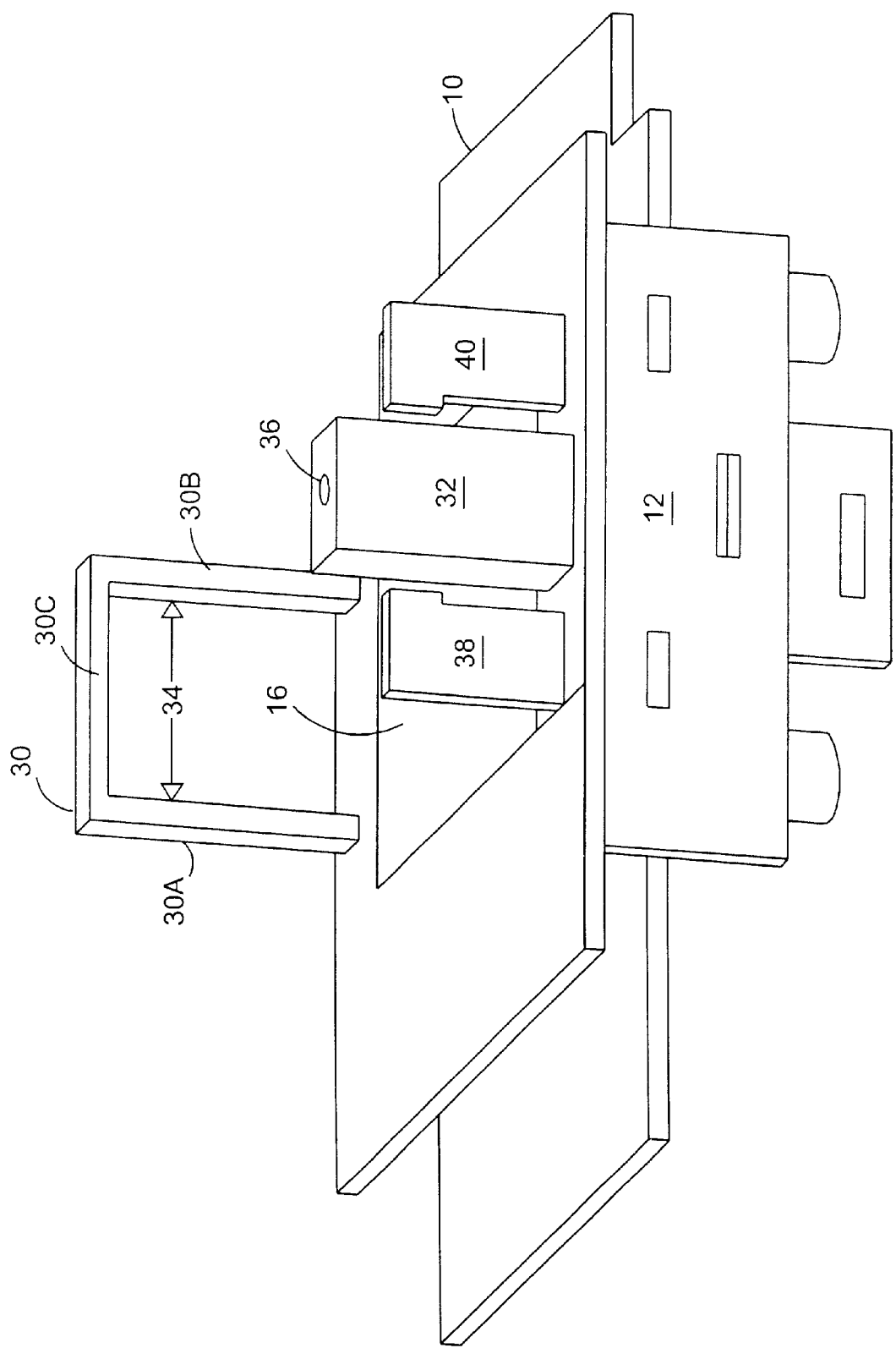
FIG. 3 shows a perspective bottom view of the power module of claim 1.

FIG. 3 shows a perspective bottom view of power module 5. As shown in FIG. 3, power substrate 16 is preferably embedded in power shell 12. The bottom surface of power substrate 16 is exposed and is placed in contact with a heatsink (not shown) so as to dissipate the heat that is generated by semiconductor devices (18, 20, FIG. 2).

Power shell 12 is preferably integrally formed with retainer posts 30, 32. Retainer posts 30, 32 receive a heatsink retainer (not shown) as will be described later. Preferably, one of retainer posts 30, 32 is a U-shaped post 30. U-shaped post 30 includes two substantially parallel sides 30A, 30B and a common portion 30C which is integral with sides 30A, 30B so as to form a U-shaped structure. U-shaped post 30 is disposed on a side of power substrate 16. The two free ends of U-shaped post 30, i.e., the ends of sides 30A, 30B that are not integral with common portion 30C, are integrally connected to the bottom side of power shell 12, so as to create a path 34 for a heatsink retainer (not shown) to enter during the installation of the heatsink (not shown) as will be described later.

Preferably, another one of heatsink retainer posts 30, 32 is a bar-shaped post 32. Bar-shaped post 32 is preferably integrally connected with power shell 12 at its base and extends away from its bottom surface. Preferably, bar-shaped post 32 has formed thereon a blind hole 36 for receiving a fastener, such as a self-tapping fastener (not shown).

Preferably, two snaps 38, 40 are disposed on either side of bar-shaped post 32. Snaps 38, 40 are integrally connected with power shell 12 and extend away from the bottom surface of power shell 12 substantially parallel to bar-shaped post 32.

Figure 4:
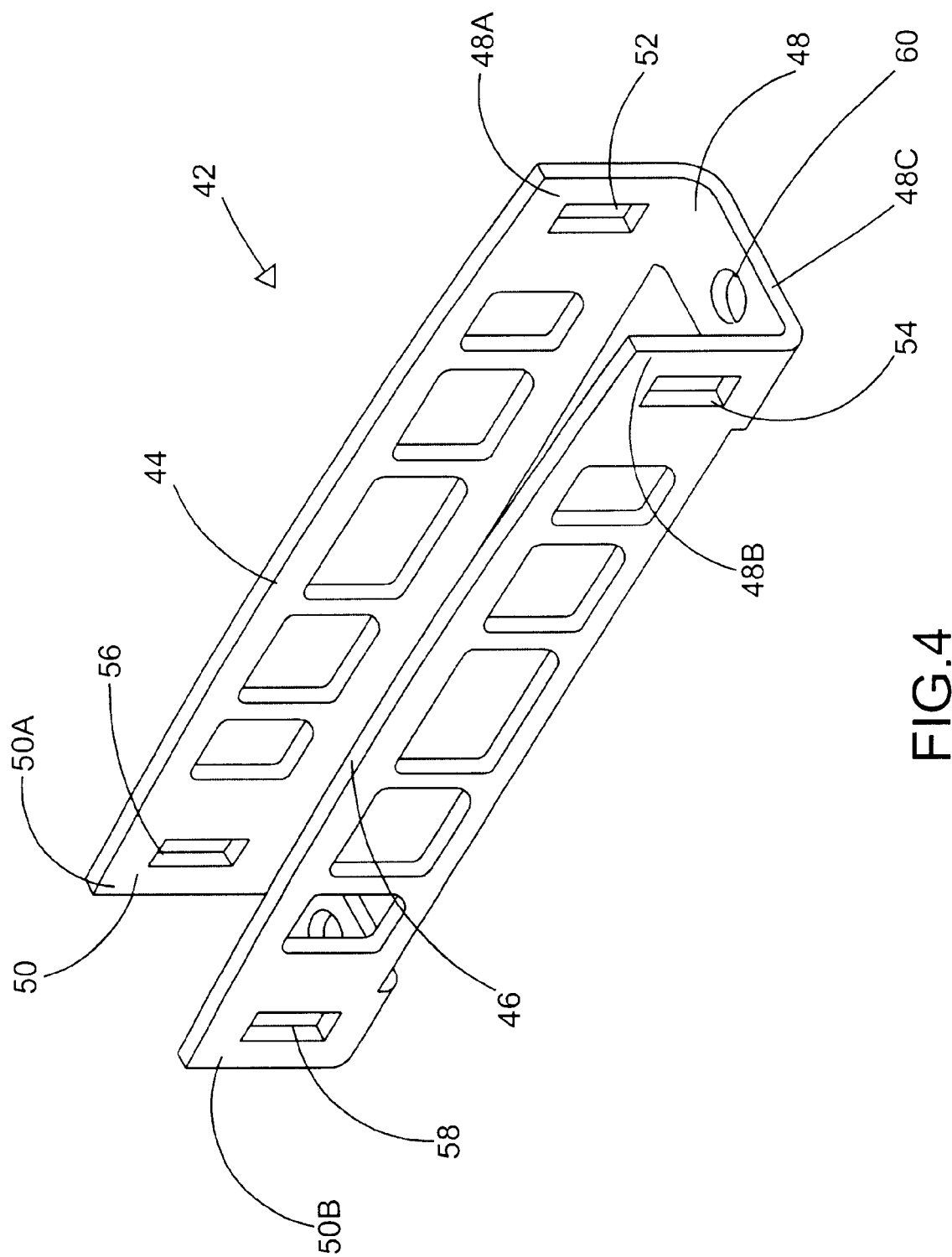
FIG. 4 shows a perspective view of a heatsink retainer according to the present invention as mounted on the power module of FIG. 1.

FIG. 4 shows a perspective view of a heatsink retainer 42 according to the present invention as assembled on power module 5. Heatsink retainer 42 preferably includes two blade portions 44, 46. Two blade portions 44, 46 are integrally connected at their respective ends with two mounting brackets 48, 50. Each of the mounting brackets 48, 50 is substantially U-shaped and includes wing portions (e.g. 48A, 48B) and a base (e.g. 48C) portion. Each of the wing portions 48A, 48B includes a respective slot 52, 54, 56, 58. Base portions (e.g. 48C) of each of mounting brackets 48, 50 preferably includes a mounting hole (e.g. 60).

FIG. 5 shows a side view of heatsink retainer 42. As shown in this figure each blade preferably includes several airway passages 64, 66, 68, 70, 72. Also, each blade preferably has an arcuate edge. FIG. 6 shows a top view of heatsink retainer 42. In this Figure, a base portion 50C and a mounting hole 62 are explicitly shown. FIG. 6A shows a cross-section of mounting bracket 48 along line B—B in FIG. 6. In FIG. 6A, slots 52, 54 and mounting hole 60 are explicitly shown. Heatsink retainer 42 may be made from any suitable material, but is preferably made from metal. The resilience of heatsink retainer 42 may be controlled by material choice, thickness of the material used, and stamping design.

Figure 7:
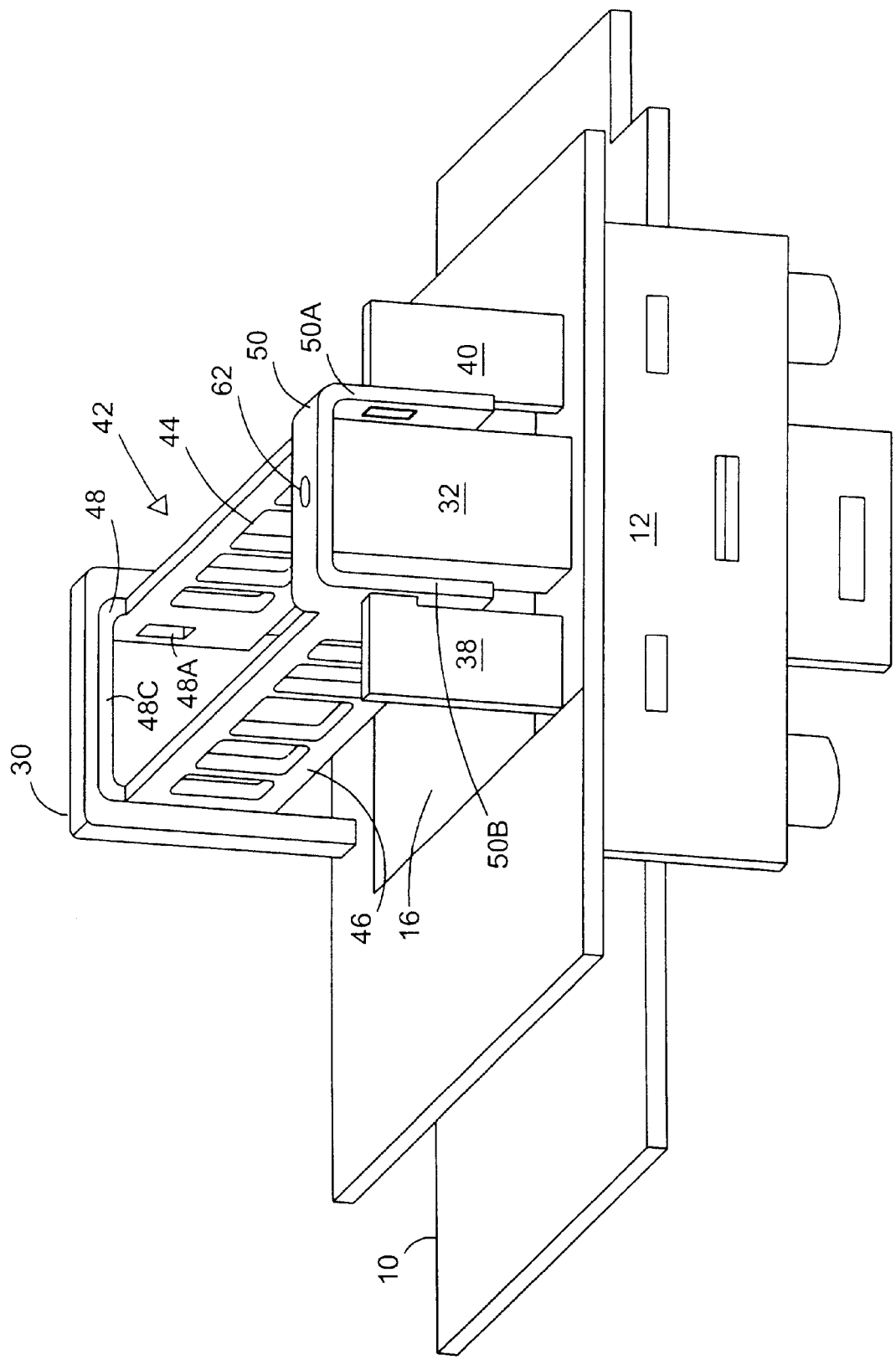
FIG. 7 shows a heatsink retainer as assembled on the heatsink retainer posts on the power shell.

FIG. 7 shows heatsink retainer 42 as it is assembled on retainer posts 32, 34. In this Figure, a heatsink is not shown so as to clearly show the position of heat sink retainer 42 in its assembled position. Once assembled, a mounting bracket (e.g. 48) of heatsink retainer 42 is disposed within path 34 (FIG. 3). Preferably, path 34 (FIG. 3) is just large enough to accommodate a mounting bracket (e.g. 48) of heatsink retainer 42. Once disposed within path 34 (FIG. 3), wing portions (e.g. 48A) and base portion 48C of mounting bracket 48 of heatsink retainer 42 are in; contact with the interior surface of U-shaped retainer post 30. The other mounting, bracket 50 of heatsink retainer 42 is disposed over bar-shaped post 32 such that wings 50A, 50B are positioned on either side of bar-shaped post 32. Snaps 38, 40 snap into slots 58, 56 respectively to hold heatsink retainer 42 in place. Mounting hole 62 is aligned with blind hole (36, FIG. 3). A fastener (not shown) is inserted into blind hole 36 to fasten heatsink retainer 42 to bar-shaped post 32, thereby fastening heatsink retainer 42 to power shell 12.

Figure 8:
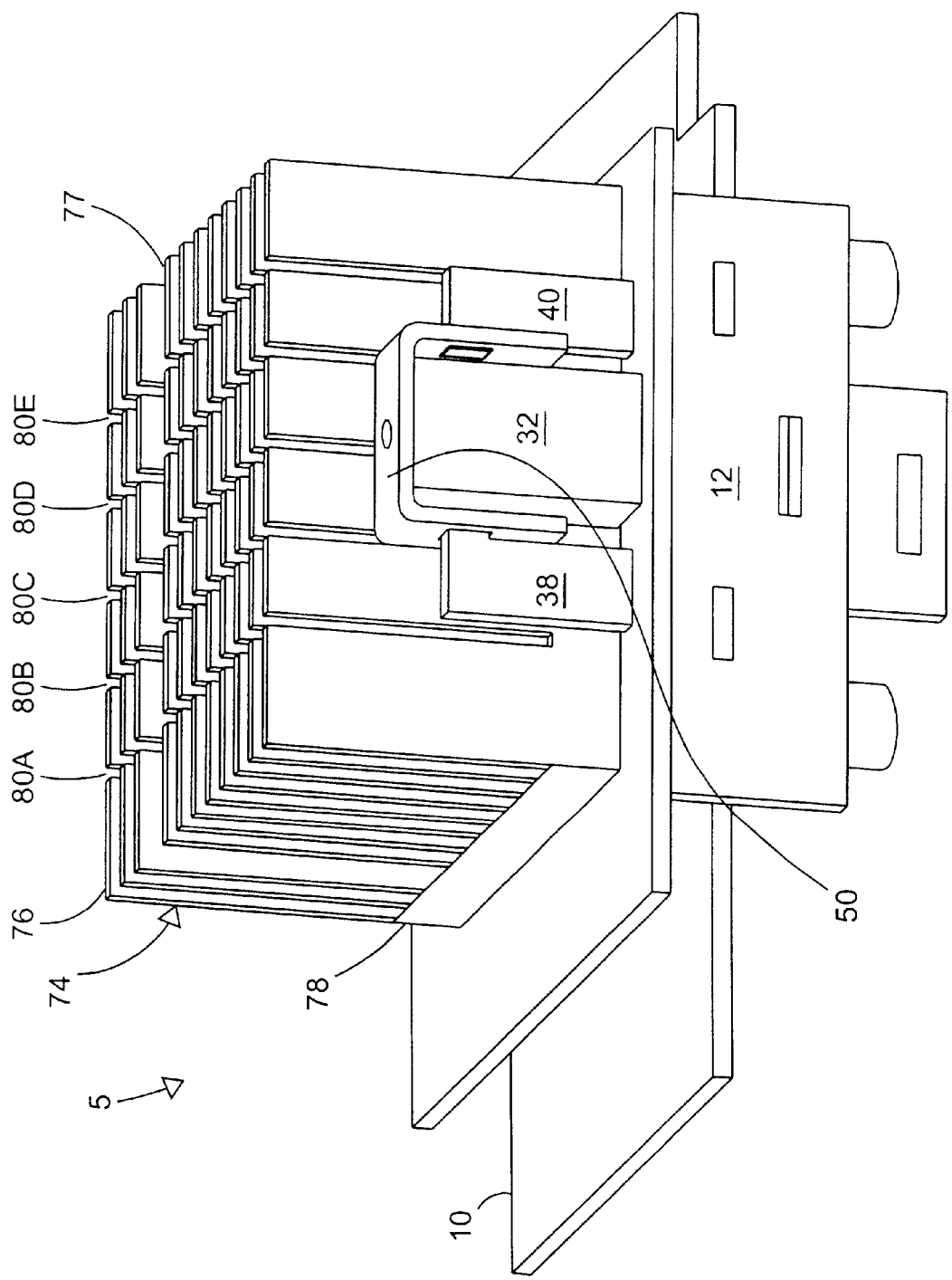
FIG. 8 shows a power module having a heatsink mounted on the bottom thereof according to an aspect of the present invention.

FIG. 8 shows power module 15 having a heatsink 74 mounted on the bottom thereof by heatsink retainer 42. Heatsink 74 includes a plurality of laterally spaced heatsink fins (e.g. 76, 77) which are integrally connected to one face of heatsink base 78. Heatsink fins (e.g. 76, 77) are substantially parallel to one another and extend away from heatsink base 78. A plurality of laterally spaced grooves 80A, 80B, 80C, 80D, 80E are cut into heatsink fins (e.g. 76, 77). Grooves 80A, 80B, 80C, 80D, 80E preferably extend down to heatsink base 78, and are preferably cut orthogonal to the direction of elongation heatsink fins (e.g. 76, 77). Blades (44, 46, FIG. 4) of heatsink retainer 42 fit inside grooves 80B and 80D of heatsink 74 when heatsink retainer 42 is assembled on power shell 12 as previously described with reference to FIG. 3, thereby securing heatsink 74 to the bottom of power shell 12. Once heatsink 74 is secured in place, bottom of heatsink base 78 is in intimate contact with the bottom surface of power substrate 16. Preferably, a thermal interface (not shown) such as grease or thermal tape is disposed between bottom of heatsink base 78 and power substrate 16 (FIG. 3) to enhance the thermal coupling of these two elements.

Figure 9:
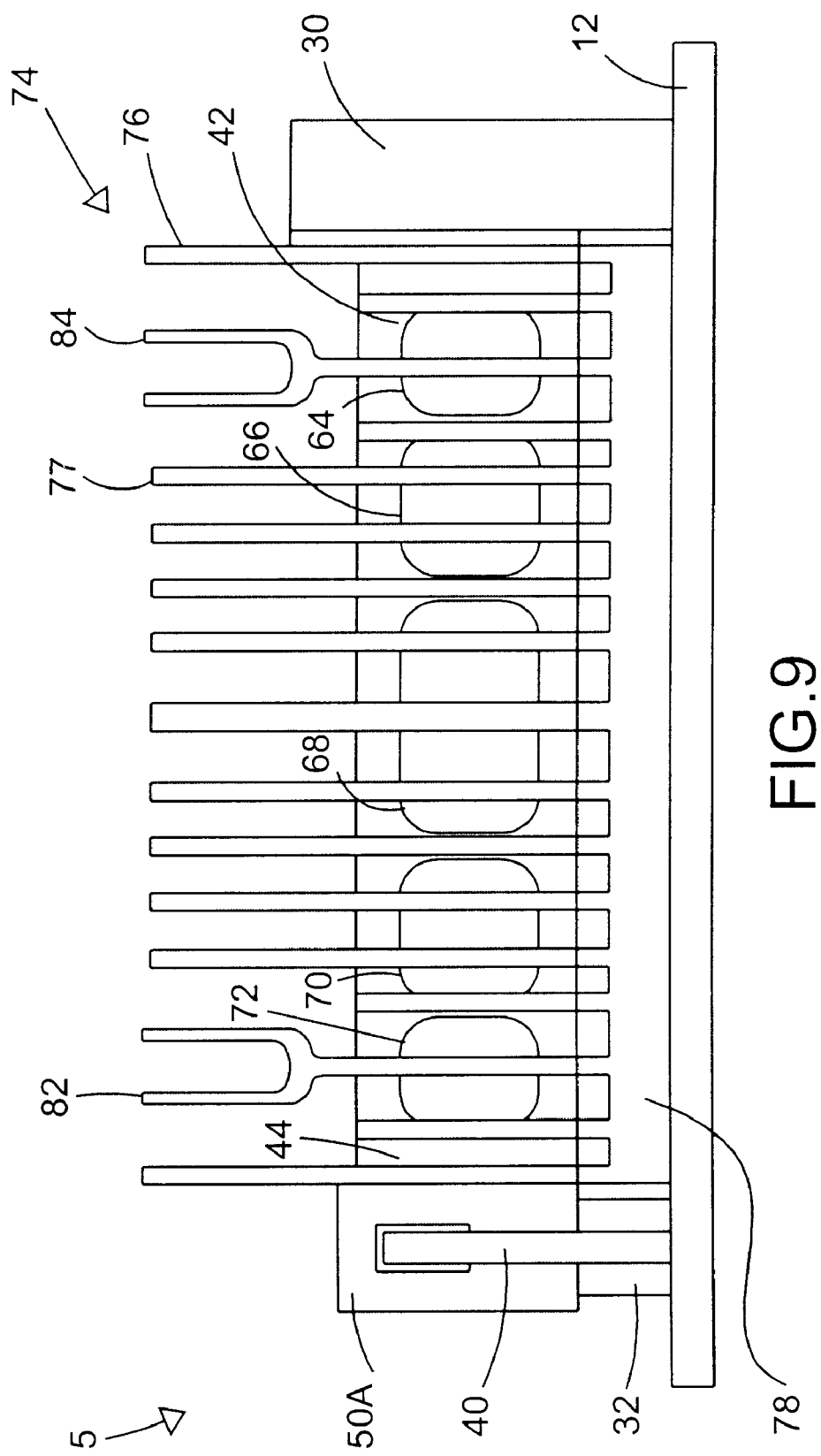
FIG. 9 is a side view of a module according to the present invention having a heatsink mounted on the bottom thereof.

FIG. 9 is a side view of power module 5 having mounted on the bottom thereof heatsink 74. As shown, blades (e.g. 44) of heatsink retainer 42 bias heatsink 74 against power substrate (16, FIG. 3) to ensure intimate thermal coupling. Airway passages 72, 70, 68, 66, 64 allow the air to flow along surfaces of heatsink fins (e.g. 76, 77) and thus do not hinder heat dissipation significantly. Heatsink 74 preferably includes two fan stands 82, 84. Fan stands 82, 84 receive a fan (not shown), which is optionally used to further the dissipation of heat by forcing air through fins (e.g. 76, 77) of heatsink 74.

Figure 10:
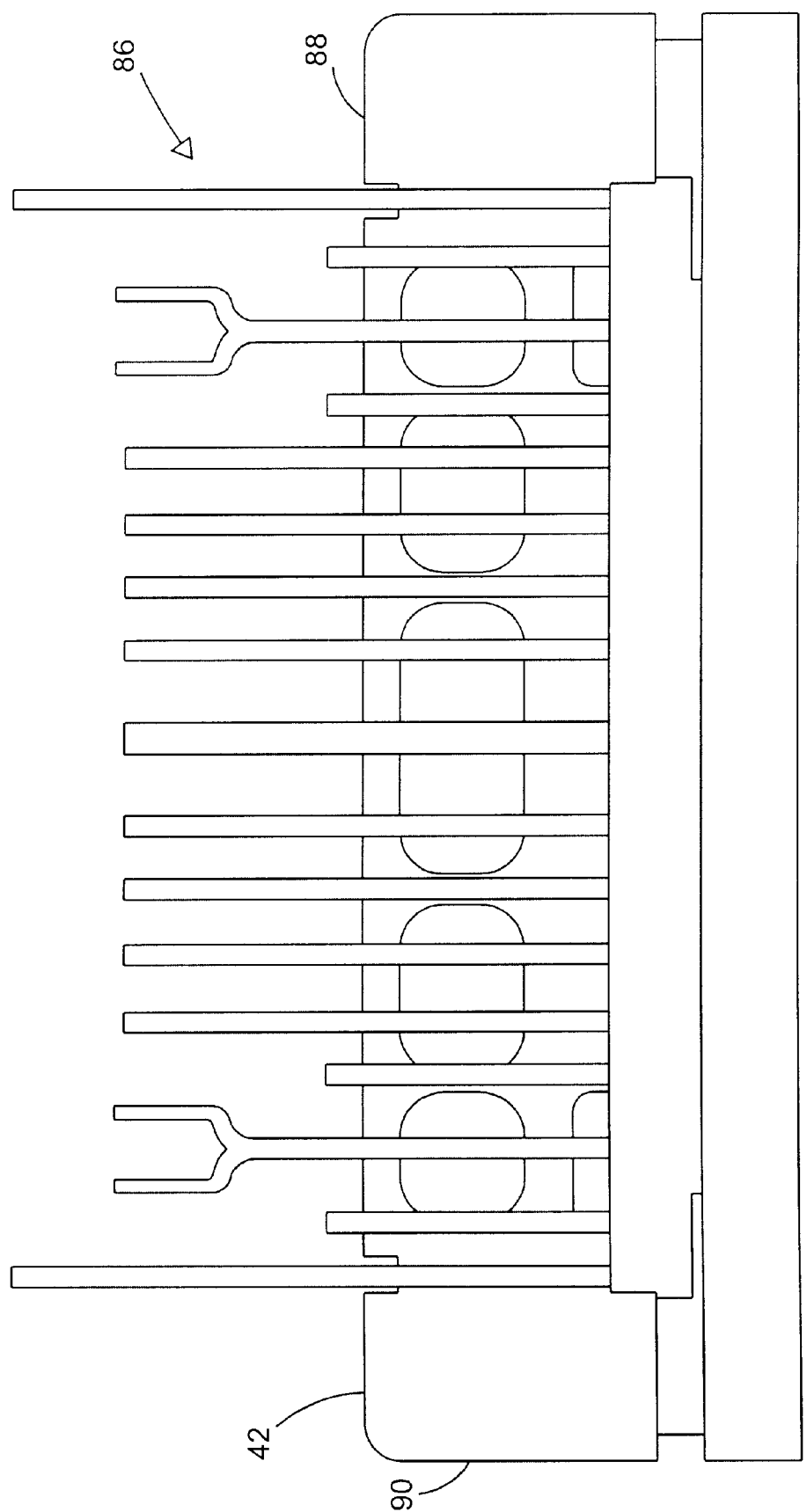
FIG. 10 shows a side view of a heatsink retainer according to a second embodiment of the present invention.

FIG. 10 shows a side view of a heatsink retainer 86 according to a second embodiment as assembled on a power module. Heatsink retainer 86 includes two identical mounting brackets 88, 90.

Figure 10A:
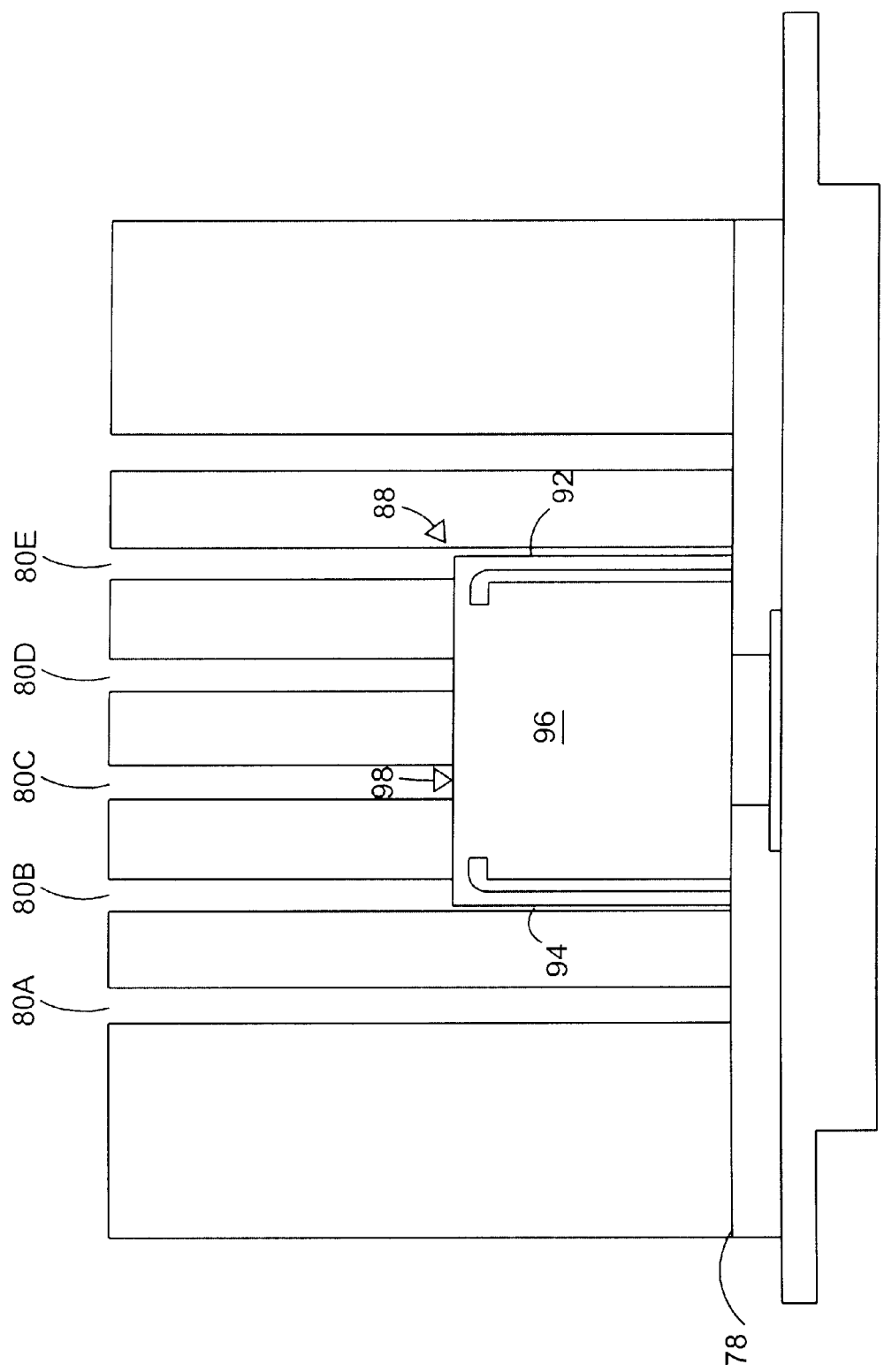
FIG. 10A shows a mounting bracket on a heatsink retainer according to the second embodiment.

FIG. 10A shows mounting bracket 88. As shown, mounting bracket 88 includes three wings 92, 94, 96 all integrally connected with a base 98. Heatsink retainer 86 is mounted on power module by vertically passing its blades in heatsink grooves 80B, 80E down to heatsink base 78.

Figure 10B:
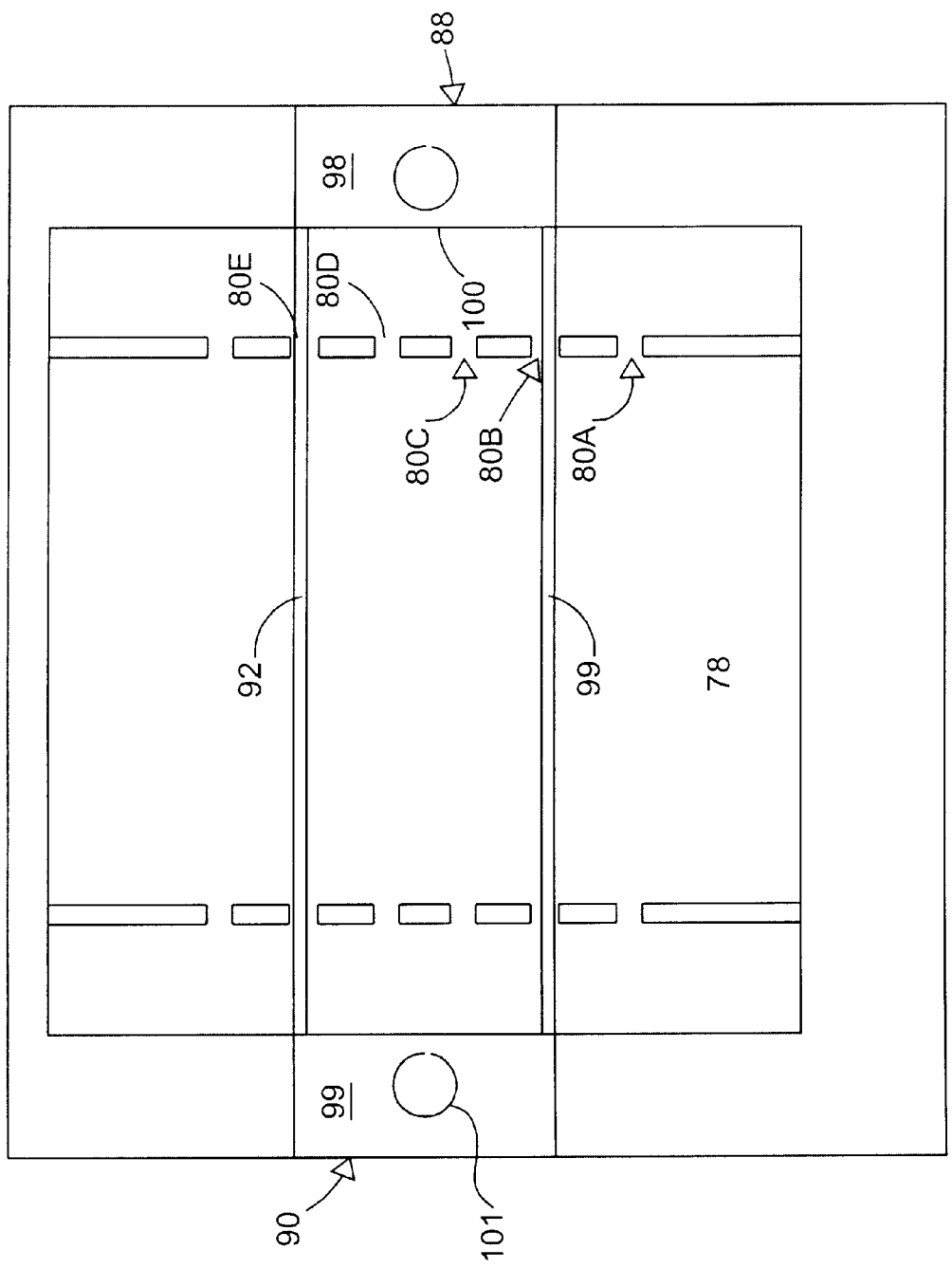
FIG. 10B shows a heatsink retainer according to the second embodiment as assembled on a power module.

FIG. 10B shows a top view of heatsink retainer 86 in its assembled position. Base 98, 99 of mounting brackets 88, 90 each includes a mounting hole 100, 101. Mounting holes 100, 101 are aligned with fastener holes (not shown) in retainer brackets (not shown). Once fasteners (not shown) are in place, retainer 86 clamps heatsink 42 against power substrate 16 and keeps the two thermally coupled. The retainer poses in the second embodiment are structurally the same.

To gain additional cooling performance from the heatsink, the fins of the heatsink may be oriented to face a ventilation opening in the housing (not shown) of the power module. Additionally, other methods such as clipping or snap fitting the heatsink retainer to an appropriate mating part on the power shell may be used to mount the heat sink on the substrate.

A module according to the present invention does not require mounting holes on the PCB. Therefore, the PCB gains layout space which may be used for copper traces. This is specially advantageous for a PCB that has an opening disposed over the substrate in that bottleneck areas around the opening have more surface area available for copper trace disposition without concern for strike and creepage, distances between the traces and the mounting hardware that is conventionally used to mount a heatsink to the underside of the PCB. Eliminating the mounting hardware is also advantageous in that the mounting hardware interfere with large circuit components such as filter capacitors which are typically disposed over;the gel box.

Additionally, a heatsink retainer according to the present invention makes use of cut slots in the heatsink fins without the necessity of removing a wider area of fin material that would be necessary by typical industry practices such as spring clips.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
   a power circuit board having a plurality of control elements disposed thereon;
   a power shell, said power shell including a plurality of snaps snapping onto corresponding protrusions on said power circuit board;
   a thermally conductive substrate embedded in said power shell and having an exposed surface; and
   at least one power semiconductor device disposed on a surface opposing said exposed surface of said thermally conductive surface.

2. The power module of claim 1, wherein said power circuit board includes an opening, said opening being disposed over said at least one power semiconductor device.

3. The power module of claim 1, further comprising potting compound disposed over said at least one power semiconductor device.

4. The power module of claim 1, wherein said power shell includes at least one flange, said flange engaging a corresponding slot in said power circuit board.

5. The power module of claim 1, further comprising a heat sink in thermal contact with said exposed surface of said thermally conductive substrate.

6. The power module of claim 5, further comprising a heat sink retainer, said heat sink retainer being mountable on said power shell and having a biasing member to bias said heat sink against said exposed surface.

7. The power module of claim 5, further comprising one of thermal grease and thermal tape disposed between said heat sink and said exposed surface of said thermally conductive substrate.

8. The power module of claim 1, wherein said at least one semiconductor device is a MOS-gated device.

9. The power module of claim 1, wherein said thermally conductive substrate is one of an IMS and Direct Bond Copper.

10. The power module of claim 1, wherein said power shell comprises a heat resistive polymer.

11. A power module comprising:
    a power circuit board having a plurality of control elements disposed thereon;
    a heatsink retainer;
    a power shell, said power shell including a plurality of retainer posts;
    a thermally conductive substrate embedded in said power shell, said substrate having an exposed surface;
    a heat sink in thermal contact With said exposed surface of said thermally conductive substrate; and
    at least one power semiconductor device disposed on a surface of said thermally conductive substrate opposing said exposed surface;
    wherein said heatsink retainer is mountable on said plurality of retainer posts to bias said heat sink against said exposed surface of said thermally conductive substrate.

12. The power module of claim 11, wherein said heatsink retainer includes a blade having a biasing edge, said biasing edge being in contact with said heatsink to bias said heatsink against said exposed surface of said thermally conductive substrate.

13. The power module of claim 12, wherein said biasing edge is arcuate.

14. The power module of claim 11, wherein said heatsink retainer is snappable into a snap member on said power shell.

15. The power module of claim 11, wherein one of said retainer posts is U-shaped and another one of said plurality of retainer posts is bar-shaped.

16. The power module of claim 15, wherein said bar-shaped retainer post includes a blind mounting hole for receiving a mounting fastener and said heatsink retainer includes a mounting hole corresponding to said blind hole.

17. The power module of claim 11, further comprising one of thermal grease and thermal tape disposed between said heatsink and said exposed surface of said thermally conductive substrate.

18. The power module of claim 11, wherein said at least one semiconductor device is a MOS-gated device.

19. The power module of claim 11, wherein said thermally conductive substrate is one of an IMS or Direct Bond Copper.

20. The power module of claim 11, wherein said power shell comprises a heat resistive polymer.

21. The power module of claim 11, wherein said heatsink comprises a plurality of laterally spaced fins extending away from a heatsink base plate, and at least one slot in said laterally spaced fins.

22. The power module of claim 21, wherein said heatsink retainer includes a blade disposed in said at least one slot in said laterally spaced fins.

23. The power module of claim 11, wherein said plurality of retainer posts and said power shell are of a unitary configuration.

24. The power module of claim 11, wherein said heatsink includes at least one fan stand.

25. The power module of claim 11, wherein said heatsink retainer includes air passageways formed therein.

* * * * *